(12) United States Patent
Kanaya (10) Patent No.: US 7,508,020 B2
(45) Date of Patent: Mar. 24, 2009

(54) SEMICONDUCTOR DEVICE AND METHOD OF MANUFACTURING THE SAME

(75) Inventor: Hiroyuki Kanaya, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 506 days.

(21) Appl. No.: 11/385,999

(22) Filed: Mar. 22, 2006

(65) Prior Publication Data

US 2007/0052065 A1    Mar. 8, 2007

(30) Foreign Application Priority Data

Sep. 13, 2005    (JP)    ............................. 2005-264995

(51) Int. Cl.
*H01L 29/94*    (2006.01)

(52) U.S. Cl. .................. 257/295; 257/307; 257/532

(58) Field of Classification Search .................. 257/295, 257/307, 532
See application file for complete search history.

(56) References Cited

U.S. PATENT DOCUMENTS

| 6,521,928 | B2 * | 2/2003 | Nishikawa et al. .......... 257/295 |
| 6,784,473 | B2 * | 8/2004 | Sakai et al. .................. 257/295 |
| 2007/0281372 | A1 * | 12/2007 | Takiguchi et al. .............. 438/3 |

* cited by examiner

*Primary Examiner*—Douglas M Menz
(74) *Attorney, Agent, or Firm*—Oblon, Spivak, McClelland, Maier & Neustadt, P.C.

(57) ABSTRACT

A semiconductor device comprising a substrate and a ferroelectric capacitor formed on the substrate. The ferroelectric capacitor includes a lower electrode, an upper electrode and a ferroelectric film interposed between the lower and upper electrodes. The ferroelectric capacitor having sidewalls receded from sidewalls of the upper electrode.

7 Claims, 7 Drawing Sheets

SEMICONDUCTOR DEVICE AND METHOD OF MANUFACTURING THE SAME

CROSS-REFERENCE TO RELATED APPLICATIONS

This application is based upon and claims the benefit of priority from prior Japanese Patent Application No. 2005-264995, filed Sep. 13, 2005, the entire contents of which are incorporated herein by reference.

BACKGROUND OF THE INVENTION

1. Field of the Invention

The present invention relates to a semiconductor device having ferroelectric capacitors, such as a ferroelectric random access memory (FeRAM) or a micro-electrical mechanical system (MEMS), and a method of manufacturing the semiconductor device

2. Description of the Related Art

In recent years, the integration density of dynamic random access memories (DRAMs) has increased. As the integration density increases, the capacitance of each element is approaching its lower limit (i.e., the smallest capacitance below which the element can no longer operate). Hence, nonvolatile semiconductor memories having ferroelectric capacitors, such as FeRAMs, are being developed as devices in which elements can operate even at a smaller capacitance. To manufacture a semiconductor memory of this type, ferroelectric capacitors must be formed at a time by using one mask (1PEP) to raise the integration density.

However, the material used for the electrodes of the ferroelectric capacitor, particularly precious metal (Pt or Ir), is far less volatile than is desired. Consequently, metal residue may lie between the upper and lower electrodes of each capacitor if the capacitors are formed at a time by means of reactive ion etching (RIE). The metal residue will induce capacitor leakage, which increases defective bits or defective chips in numbers. Thus, the metal residue will lower the manufacture yield of the products.

In manufacturing a FeRAM having ferroelectric capacitors, metal residue is formed when ferroelectric capacitors are formed at a time, each comprising a lower electrode, a ferroelectric layer and an upper layer. The metal residue induces capacitor leakage, which increases defective bits or defective chips in numbers. This problem is not limited to nonvolatile semiconductor memories such as FeRAMs. Rather, the problem may arise in various semiconductor devices that comprise ferroelectric capacitors.

BRIEF SUMMARY OF THE INVENTION

According to an aspect of this invention, there is provided a semiconductor device, comprising:

a substrate; and a ferroelectric capacitor formed on the substrate, comprising a lower electrode, an upper electrode and a ferroelectric film interposed between the lower and upper electrodes, and having sidewalls receded from sidewalls of the upper electrode.

According to another aspect of this invention, there is provided a semiconductor device, comprising:

a substrate; and a ferroelectric capacitor provided on the substrate and fabricated by forming a lower electrode, a ferroelectric film and a mask-material film on a part of the substrate, by making an opening in the mask-material film and by burying the upper electrode in the opening.

According to still another aspect of this invention, there is provided a semiconductor device, comprising:

a substrate;

a ferroelectric capacitor provided on the substrate and comprising a lower electrode, an upper electrode and a ferroelectric film interposed between the upper and lower electrodes, the upper electrode being provided in a region inner of a peripheral region of the ferroelectric film; and a mask-material film provided on the ferroelectric film and surrounding the peripheral region of the upper electrode.

DETAILED DESCRIPTION OF THE INVENTION

Embodiments of the present invention will be described, thus explaining the invention in detail.

First Embodiment

Figure 1:
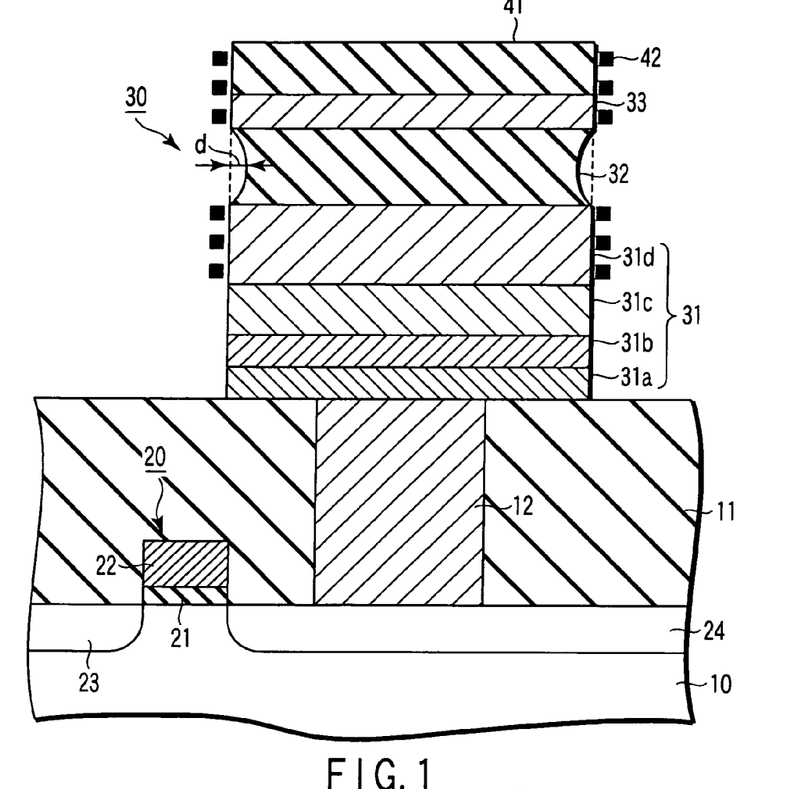
FIG. 1 is a sectional view showing FeRAM cell according to a first embodiment of the present invention.

FIG. 1 is a sectional view showing FeRAM cell according to the first embodiment of this invention.

As FIG. 1 shows, a gate insulating film 21 is provided on Si substrate 10, and a gate electrode 22 is provided on the gate insulating film 21. Using the gate electrode 22 as mask, a source region 23 and a drain region 24 are formed. Thus, the film 21, electrode 22 and regions 23 and 24 constitute a switching transistor 20.

An interlayer insulating film 11 is provided on the substrate 10 and covers the transistor 20. A plug electrode 12 is buried in the interlayer insulating film 11. The plug electrode 12 therefore connects the drain region 24 of the transistor 20 to the interlayer insulating film 11. On a part of the interlayer insulating film 11 there is provided a ferroelectric capacitor 30 that contacts the plug electrode 12. The capacitor 30 comprises a lower electrode 31, a ferroelectric film 32 and an upper electrode 33. The lower electrode 31 is a TiAlN layer or a Ti/Ir/IrO$_2$/Ti/Pt/Ti layer. Nonetheless, the electrode 31 shown in FIG. 1 is composed of Ti layer 31a, Ir layer 31b, IrO$_2$ layer 31c and Pt layer 31d only. The ferroelectric film 32 is made of PZT. The upper electrode 33 is SrRuO$_3$/IrO$_2$ layer. Only the IrO$_2$ layer is shown in FIG. 1.

Note that the layers constituting the ferroelectric capacitor 30 have been formed by means of dry etching using a hard mask 41 made of $SiO_2$ or the like. Metal residue 42 formed during the dry etching lie on the sidewalls of the ferroelectric capacitor 30.

The structure thus formed is identical in configuration to the conventional FeRAM cell. In the present embodiment, side etching is performed on the ferroelectric film 32, receding the sidewalls of the ferroelectric film 32. As the side etching proceeds, Metal residue 42 is removed from the sidewalls of the ferroelectric film 32.

Namely, the embodiment is characterized in that the sidewalls of the ferroelectric film 32 are concaved in the ferroelectric capacitor 30 comprising the lower electrode 31, ferroelectric film 32 and upper electrode 33. The residue 42 has been removed from the sides of the ferroelectric capacitor film 32.

A method of manufacturing FeRAM according to the present embodiment will be described below.

Figure 2A:
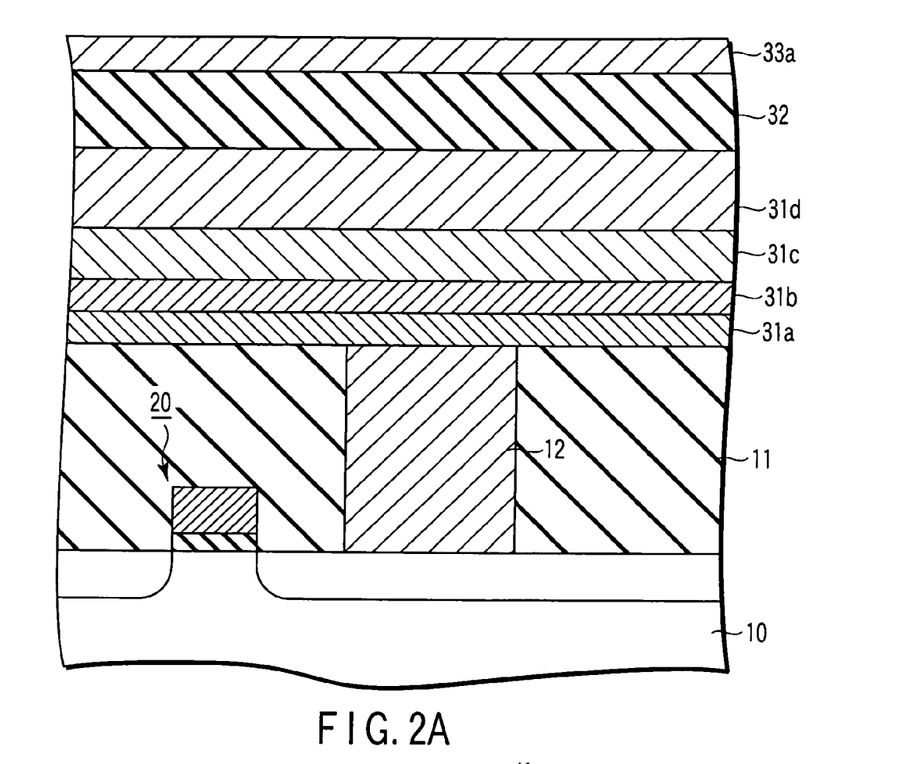
FIGS. 2A to 2C are sectional views explaining a method of manufacturing FeRAM according to the first embodiment of the invention.

First, a switching transistor 20 was formed on an Si substrate 10 as shown in FIG. 2A. Then, an interlayer insulating film 11 was formed on the substrate 10, covering the switching transistor 20. A plug electrode 12 is formed in the interlayer insulating film 11. Thereafter, a lower electrode 31 made of TiAlN or composed of films 31a to 31d (i.e., four films selected from Ti, Ir, $IrO_2$, Pt and $SrRuO_3$ films), a ferroelectric capacitor film 32 (PZT), and an upper electrode 33a ($SrRuO_3/IrO_2$) were formed, one on another, on the interlayer insulating film 11.

Figure 2B:
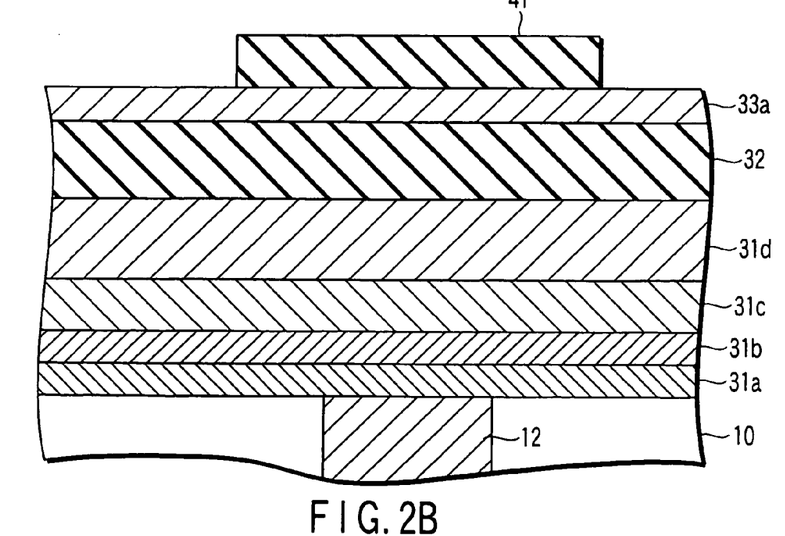

Next, a hard mask 41 was formed on the upper electrode film 33a as shown in FIG. 2B, in preparation for forming a capacitor. High-temperature etching was applied in this embodiment in order to form the capacitor. The mask 41 was therefore $SiO_2$ film. Alternatively, it may be SixNy film, $SiO_2/Al_2O_3$ film, an $Al_2O_3$ film or $SiO_2/TiAlN/Al_2O_3$ film, or any combination of these films.

Figure 2C:
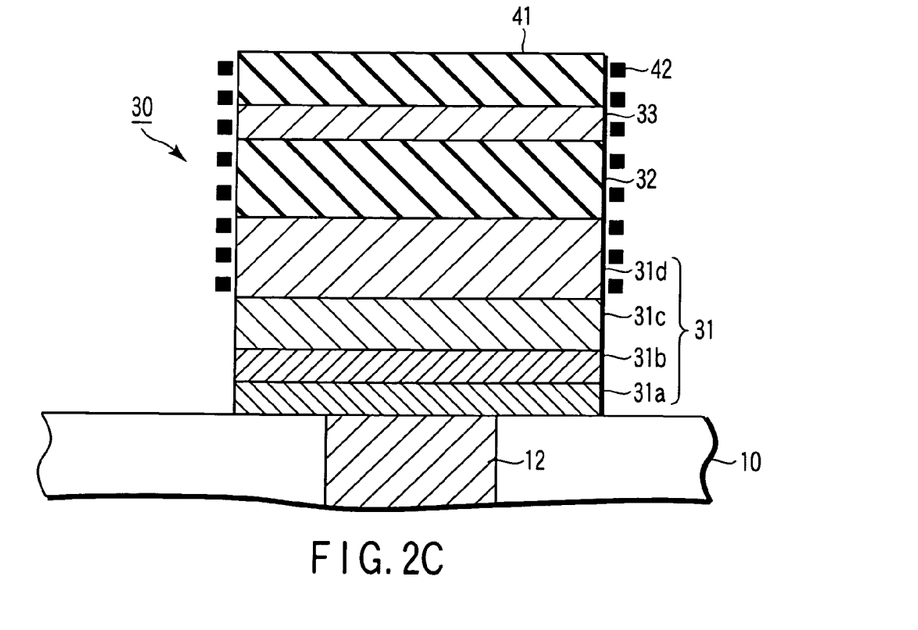

As shown in FIG. 2C, etching was performed on the upper electrode film 33a, ferroelectric film 32 and lower electrode films 31a to 31d, by using the hard mask 41. A ferroelectric capacitor 30 was thereby formed, which comprised electrodes 31 and 33 and a ferroelectric film 32 interposed between the electrodes 31 and 33. Residue 42 of Ir, i.e., a material of the electrodes, lay on the sidewalls of the capacitor 30 in most cases. The residue 42 induced capacitor leakage, lowering the yield of the product.

In order to remove the residue 42, isotropic etching was carried out in the present embodiment. More precisely, dry etching was performed on the sidewalls of the ferroelectric capacitor 30, thereby removing the source of residue. The gas used in the isotropic etching was chlorine-based gas, halogen-based gas, fluorine-based gas or reducing gas (e.g., $Cl_2$, $BCl_3$, $CF_4$, $C_2F_6$, $C_4F_8$, $CHF_3$ or CO). If the residue is of a large amount, the sidewalls of the ferroelectric capacitor should better be etched with a mixture of the above-mentioned gas and inert gas such as Ar, after the source of residue was removed to some extent. The CDE process may be employed for this purpose. The method of removing the source of residue is not limited to these, nonetheless.

During this etching, the sidewalls of the ferroelectric film 32 gradually receded, each coming to have a concave. As a result, the structure shown in FIG. 1 was obtained.

Figure 3:
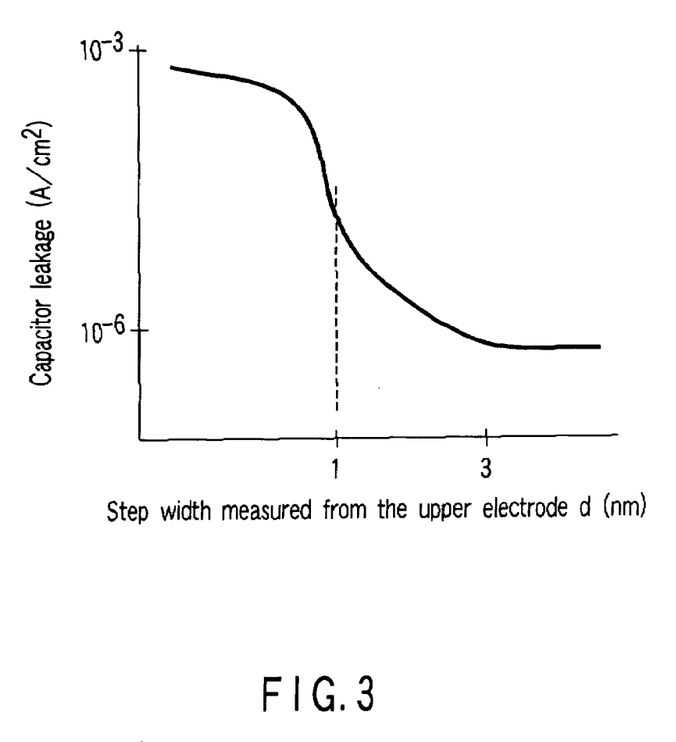
FIG. 3 is a diagram representing the relation between the concave depth d of the ferroelectric layer and the capacitor leakage current.

The inventors hereof studied the relation between the capacitor leakage current and the depth d of the concave made in the ferroelectric film 32, i.e., the step width d at the sides of the upper electrode 33. The results were as shown in FIG. 3. As seen from FIG. 3, a concave having depth of 1 nm reduced the capacitor leakage current to $10^{-3}$ $A/cm^2$ or less. A concave having depth of 3 nm reduced the capacitor leakage current to $10^{-6}$ $A/cm^2$ or less. Certainly, the absolute value of the leakage current depends on the capacitor material indeed. It is clear, however, that the concaves made in the sidewalls of the ferroelectric capacitor can decrease the capacitor leakage.

Figure 4:
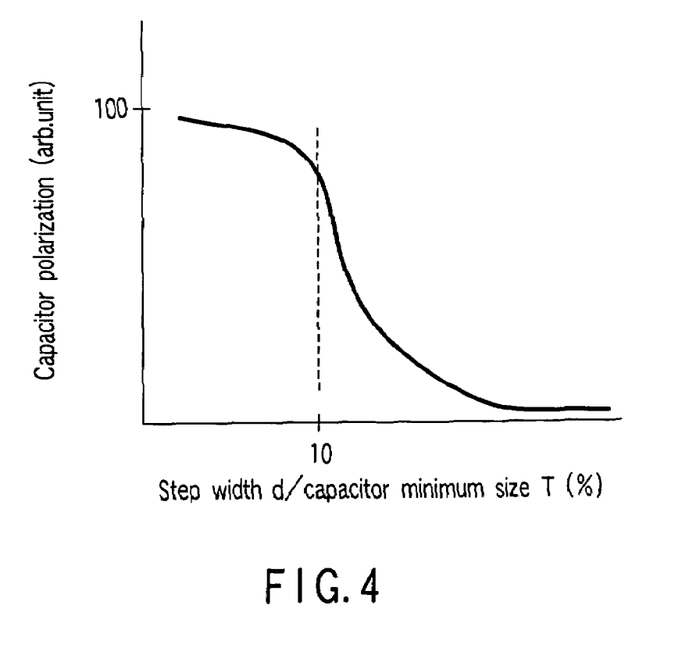
FIG. 4 is a diagram representing the relation between the concave depth d of the ferroelectric layer and the degree of capacitor polarization.

Concaves can be made by various methods. Nonetheless, the capacitor acquired good characteristics when the concaves were made by the above-mentioned dry etching or CDE process. The inventors studied the relation between the depth (step width d) of the concaves and the degree of capacitor polarization. The results were as shown in FIG. 4. As evident from FIG. 4, the capacitor was sharply degraded in characteristics when the step width d exceeded 10% of the minimum size T of the basic capacitor cell. (The capacitor was much degraded when the step width was greater than 100 nm, i.e., 10% of TE=1×1 $\mu m^2$.) Hence, the step width should be 10% of the minimum size T or less in order to reduce the leakage current and impart good polarization characteristic to the capacitor.

Thus, the present embodiment is characterized that the sidewall surfaces of the ferroelectric film 32 of the capacitor 30 recede inwards unlike the sidewalls of the upper electrode 33. While etching is being performed on the sidewalls of the ferroelectric capacitor 30, not only the ferroelectric film 32, but also the upper electrode 33 may be partly removed in some cases. In view of this, it is sufficient for the ferroelectric film 32 to be shorter than the upper electrode 33, as measured along a line perpendicular to the direction of thickness. That is, it suffices if the narrowest part of the ferroelectric film 32 is a small width than the narrowest part of the upper electrode 33.

In FIG. 2, the sidewalls of the ferroelectric capacitor 30 are illustrated as if extending vertically as is desired. In practice, the sidewalls are tapered by 65 to 85° in most cases. If the sidewalls are so tapered, the description "the sidewall surfaces of the ferroelectric film 32 of the capacitor 30 recede inwards unlike the sidewalls of the upper electrode 33" means that the sidewall surfaces of the ferroelectric film 32 do not lie on lines extending in the sidewalls surfaces of the upper electrode 33; they lie inside of these lines.

Next, a sidewall-protecting film was formed on the ferroelectric capacitor 30 that had been etched at its sidewalls. More specifically, an $Al_2O_3$ film was deposited to a thickness of 10 to 50 nm by means of ALD process or sputtering process, or both. Alternatively, the sidewall-protecting film may be a $ZrO_2$ film, $SiO_2$ film, SixNy film or SiAlxOy film, or any combination of these films. After the sidewall-protecting film was so deposited, high-temperature annealing was performed, successfully improving the polarization characteristic of the ferroelectric capacitor. This annealing is carried out, only if necessary. Note that the sidewall-protecting film can suppress the damages to the interlayer insulating film 11.

Figure 5:
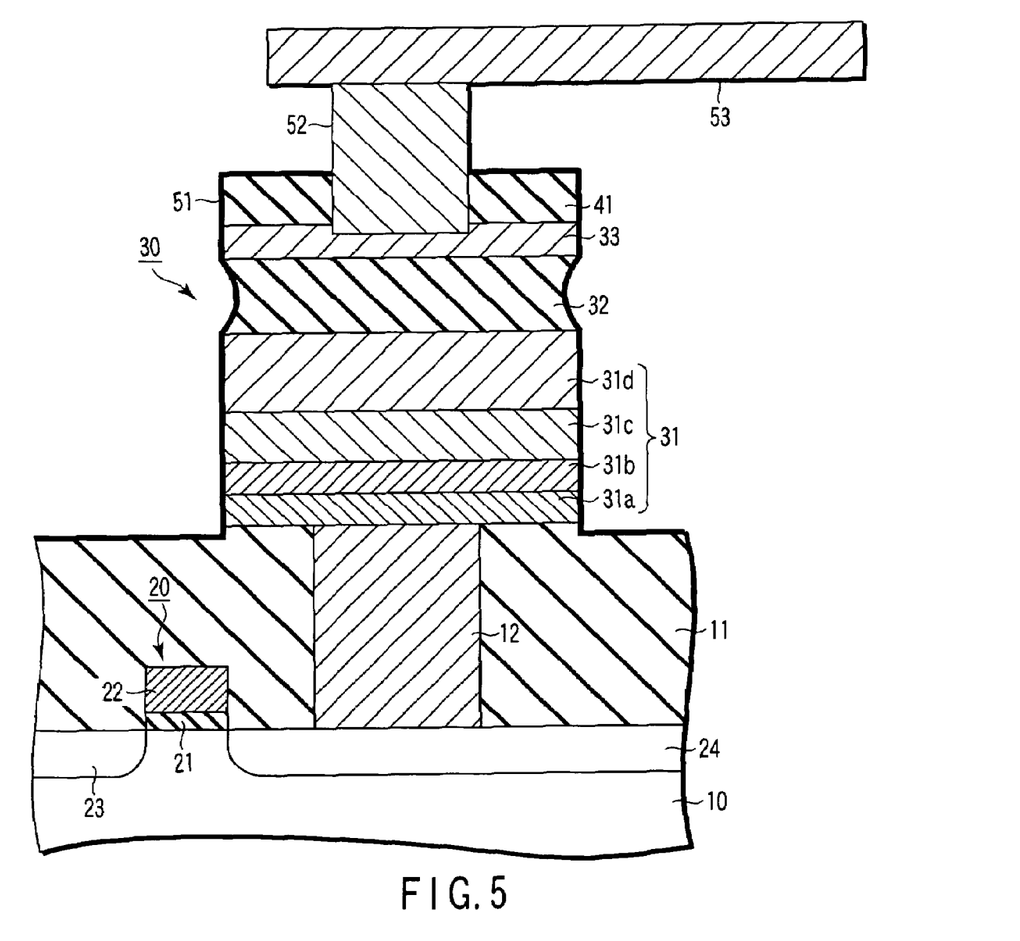
FIG. 5 is a sectional view showing the structure of an unfinished FeRAM that has metal wiring.

FIG. 5 shows a ferroelectric memory according to this embodiment, that had a metal wire formed in the step subsequent to the step of forming the sidewall-protecting film. In FIG. 5, numeral 51 denotes the sidewall-protecting film, numeral 52 designates an electrode plug, and numeral denotes the metal wire.

In the present embodiment, the ferroelectric film 32 of the capacitor 30 is dry-etched at its sidewalls in the present embodiment. This prevents short-circuiting between the lower electrode 31 and the upper electrode 33 even if metal residue remains on the sidewalls of the ferroelectric film 32. Hence, metal residue 42, if any, would not degrade the ferroelectric capacitor 30 even if the lower electrode 31, ferroelectric film 32 and upper electrode 33 are formed at a time. Thus, the capacitor leakage can be decreased, improving the characteristics of the ferromagnetic capacitor 30.

Second Embodiment

Figure 6:
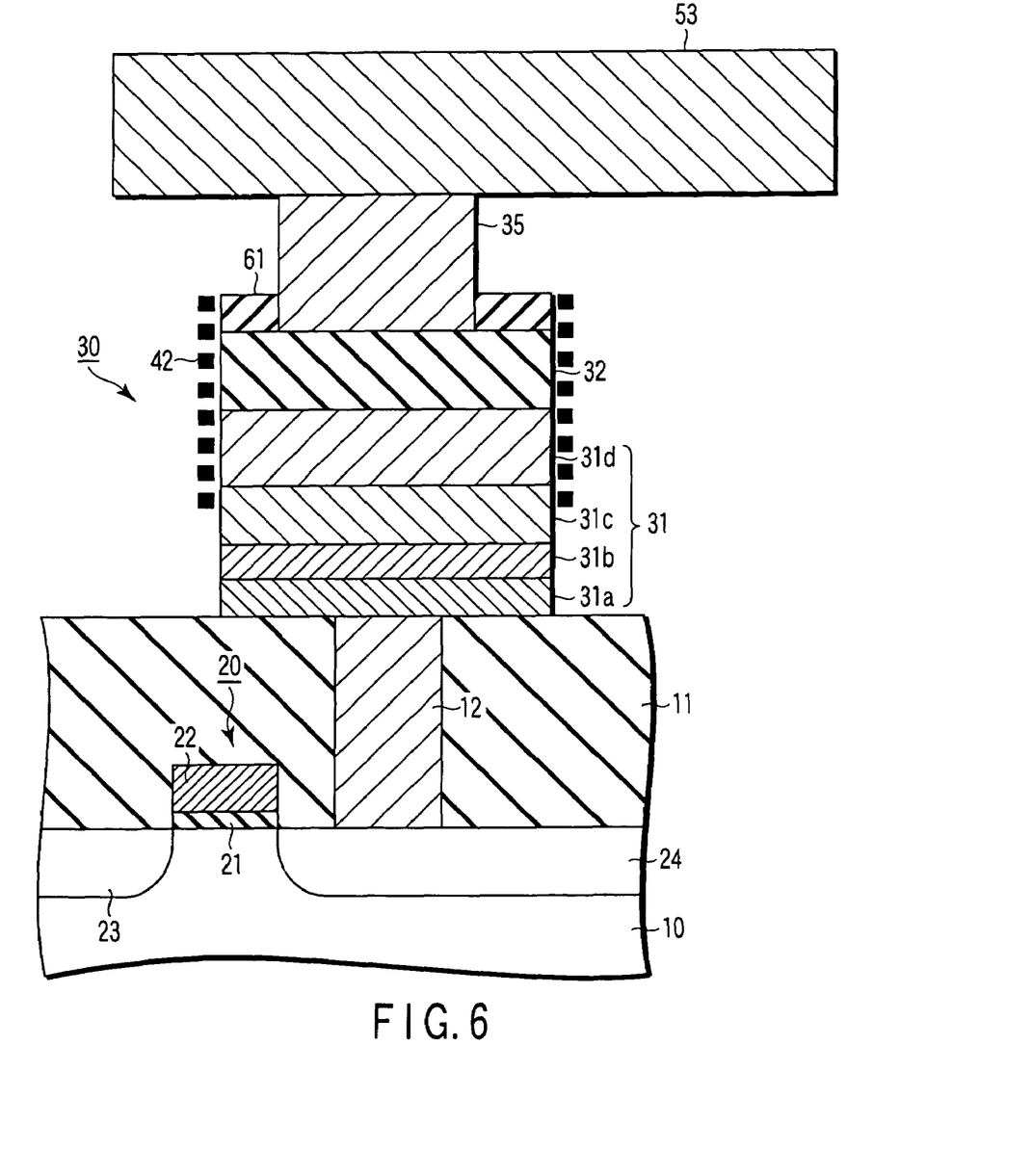
FIG. 6 is a sectional view depicting the structure of FeRAM cell according to a second embodiment of this invention.

FIG. 6 is a sectional view depicting the structure of FeRAM cell according to the second embodiment of the present invention. The components identical to those shown in FIG. 1 are designated at the same reference numerals and will not be described in detail.

As FIG. 5 depicts, a gate insulating film 21 is provided on Si substrate 10, and a gate electrode 22 is provided on the gate insulating film 21. A source region 23 and a drain region 24 have been formed by using the gate electrode 22 as mask. Thus, the film 21, electrode 22 and regions 23 and 24 constitute a switching transistor 20.

An interlayer insulating film 11 is provided on the substrate 10 and covers the transistor 20. A plug electrode 12 is buried in the interlayer insulating film 11. The plug electrode 12 therefore connects the drain region 24 of the transistor 20 to the interlayer insulating film 11. On a part of the interlayer insulating film 11 there is provided a ferroelectric capacitor 30 that contacts the plug electrode 12. The capacitor 30 comprises a lower electrode 31, a ferroelectric film 32 and an upper electrode 35. The lower electrode 31 is a TiAlN layer or a Ti/Ir/IrO$_2$/Ti/Pt/Ti layer. The electrode 31 shown in FIG. 1 is, nonetheless, composed of Ti layer 31a, Ir layer 31b, IrO$_2$ layer 31c and Pt layer 31d only. The ferroelectric film 32 is made of PZT. The upper electrode 35 is SrRuO$_3$/IrO$_2$ layer. Only the IrO$_2$ layer is shown in FIG. 1.

Note that the lower electrode 31 and ferroelectric film 32 of the ferroelectric capacitor 30 have been formed by means of dry etching using a hard mask 61 made of SiO$_2$ or the like. The mask 61 has an opening. The upper electrode 35 is formed in the opening of the mask 61. Etching residue 42 lies on the sidewalls of the ferroelectric capacitor 30.

Thus, the second embodiment is characterized in that the upper electrode 35 is formed in the opening of the mask 61, constituting the ferroelectric capacitor 30, jointly with the lower electrode 31 and the ferroelectric film 32. This configuration prevents the residue 42 on the sidewalls of the ferroelectric capacitor 30 from degrading the characteristics of the ferroelectric capacitor 30.

A method of manufacturing FeRAM according to the second embodiment will be described, with reference to FIGS. 7A and 7B.

Figure 7A:
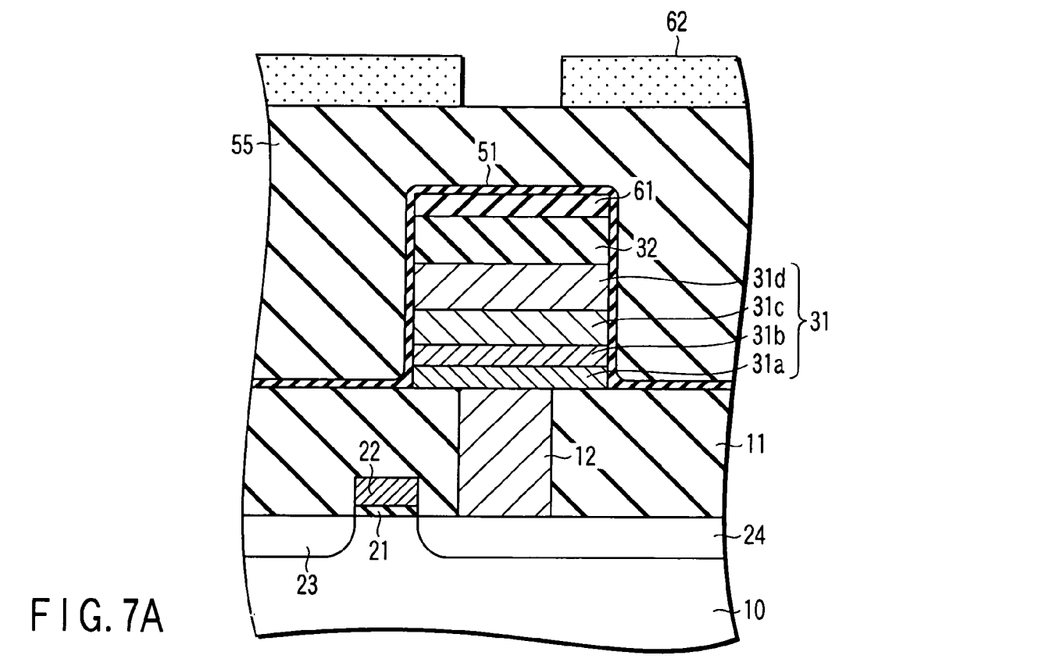
FIGS. 7A and 7B are sectional views explaining steps of manufacturing FeRAM according to the second embodiment of the invention.

First, a switching transistor 20 is formed on Si substrate 10 as shown in FIG. 7A. Then, an interlayer insulating film 11 is formed on the substrate 10, covering the switching transistor 20. A plug electrode 12 is formed in the interlayer insulating film 11. Thereafter, a lower electrode 31 made of TiAlN or composed of films 31a to 31d (i.e., four films selected from Ti, Ir, IrO$_2$, Pt and SrRuO$_3$ films) and a ferroelectric capacitor film 32 (PZT film) are formed, one on another, on the interlayer insulating film 11. Further, a hard mask (first mask) 61 having a desired capacitor shape is formed on the ferroelectric film 32. High-temperature etching is applied in the second embodiment in order to form a capacitor. The first mask 61 is therefore an Al$_2$O$_3$ film. It may be instead SiO$_2$ film, SixNy film, SiO$_2$/Al$_2$O$_3$ film, Al$_2$O$_3$ film or SiO$_2$/TiAlN/Al$_2$O$_3$ film, or any combination of these films.

Preferably, the first mask 61 may be made of alumina (Al$_2$O$_3$), zirconium oxide (ZrO$_2$), aluminum silicon oxide (AlSiO), silicon oxide (SiO$_2$), titanium oxide (TiO$_2$) or may be a multi-layer structure composed of films of these oxides.

After the Al$_2$O$_3$ mask 61 is formed, the ferroelectric film 32 and the lower electrode films 31a to 31d are subjected to dry etching using the mask 61. If the taper angle is 70° or more, the residue of the lower-electrode material may lie on the sidewalls. At this stage, however, the upper electrode has yet to be formed, and such residue, if any, would not result in capacitor leakage at all. After the dry etching is performed, an Al$_2$O$_3$ film was deposited, as sidewall-protecting film 51, to a thickness of 20 nm by means of ALD process or sputtering process, or both. The sidewall-protecting film 51 may instead be SixNy film, a ZrO$_2$ film or SiAlxOy film, or any combination of these films. The sidewall-protecting film 51 can suppress the damages to the interlayer insulating film 11.

Then, an interlayer insulating film 55 is formed on the sidewall-protecting film 51. The interlayer insulating film 55 is processed, acquiring a flat surface. Further, a second mask 62 is formed on the interlayer insulating film 55. The second mask 62 has an opening smaller than the ferroelectric capacitor that is to be fabricated. It has been formed by subjecting, for example, a resist film to photolithography, thus making the opening in the resist film.

Figure 7B:
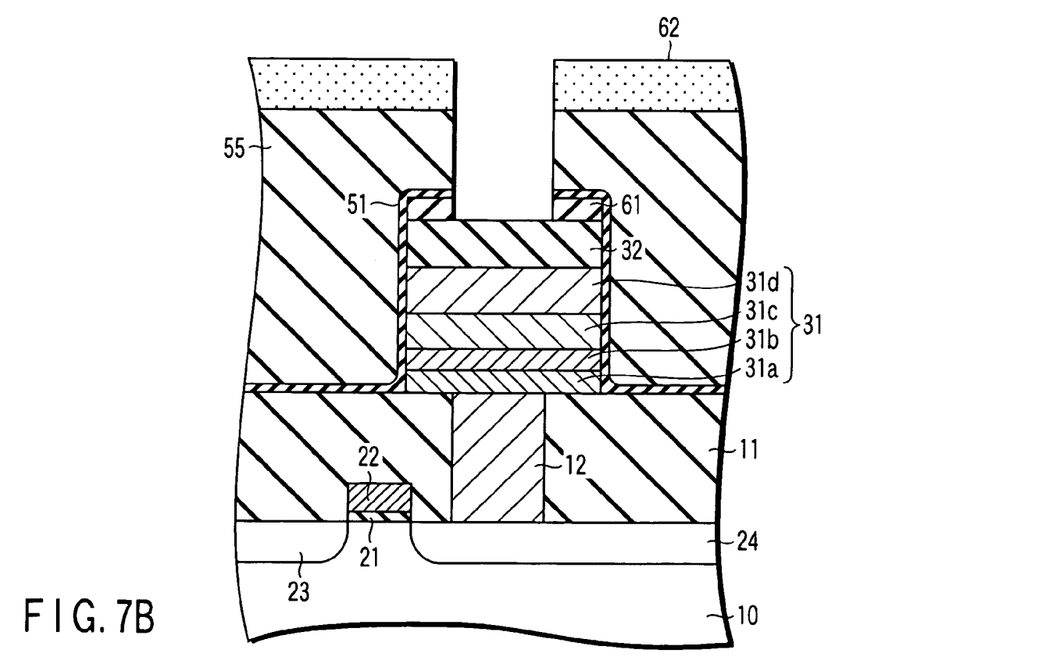

Next, RIE is carried out, using the second mask 62, making an opening in the interlayer insulating film 55 and first mask 61, as is illustrated in FIG. 7B. In the step of making this opening, the etching can be readily stopped at the Al$_2$O$_3$ mask, because SiO2, i.e., the material of the interlayer insulating film 55, and Al$_2$O$_3$, i.e., the material of the first mask 61, differ in etching rate. Thus, choline solution or the like may be applied, making in the first mask 61 an opening that exposes the ferroelectric film 32, after the etching is stopped for some time. Alternatively, RIE may be carried out, etching the interlayer insulating film 55 and the first mask 61, one after the other, thereby making a hole that reaches the ferroelectric film 32.

After the second mask 62 is removed, an upper electrode 35, or SRO/IrO2 electrode, is formed in the opening made in the interlayer insulating film 55 and first mask 61, by means of CVD or sputtering. Then, CMP or the like is performed, whereby the upper electrode 35 acquires a flat upper surface. Thereafter, on the interlayer insulating film 55, a wire 53 is formed, which is connected to the upper electrode now provided at the contact section. The structure shown in FIG. 6 is obtained.

That part of the ferroelectric film 32, which contacts the upper electrode 36, is 1 nm or more thinner than the other part. The sidewalls of the lower electrode 31 and the sidewalls of the ferroelectric film 32 lie on a line extending from the sidewall surfaces of the mask 61. That is, the sidewalls of the lower electrode 31 and the sidewalls of the ferroelectric film 32 are flush with planes equivalent to the sidewall surfaces of the mask 61. FIG. 6 shows an embodiment in which the sidewalls of the ferroelectric capacitor 30 are vertical as desired. In practice, however, the sidewalls are tapered by 65 to 85° in most cases.

Figure 8:
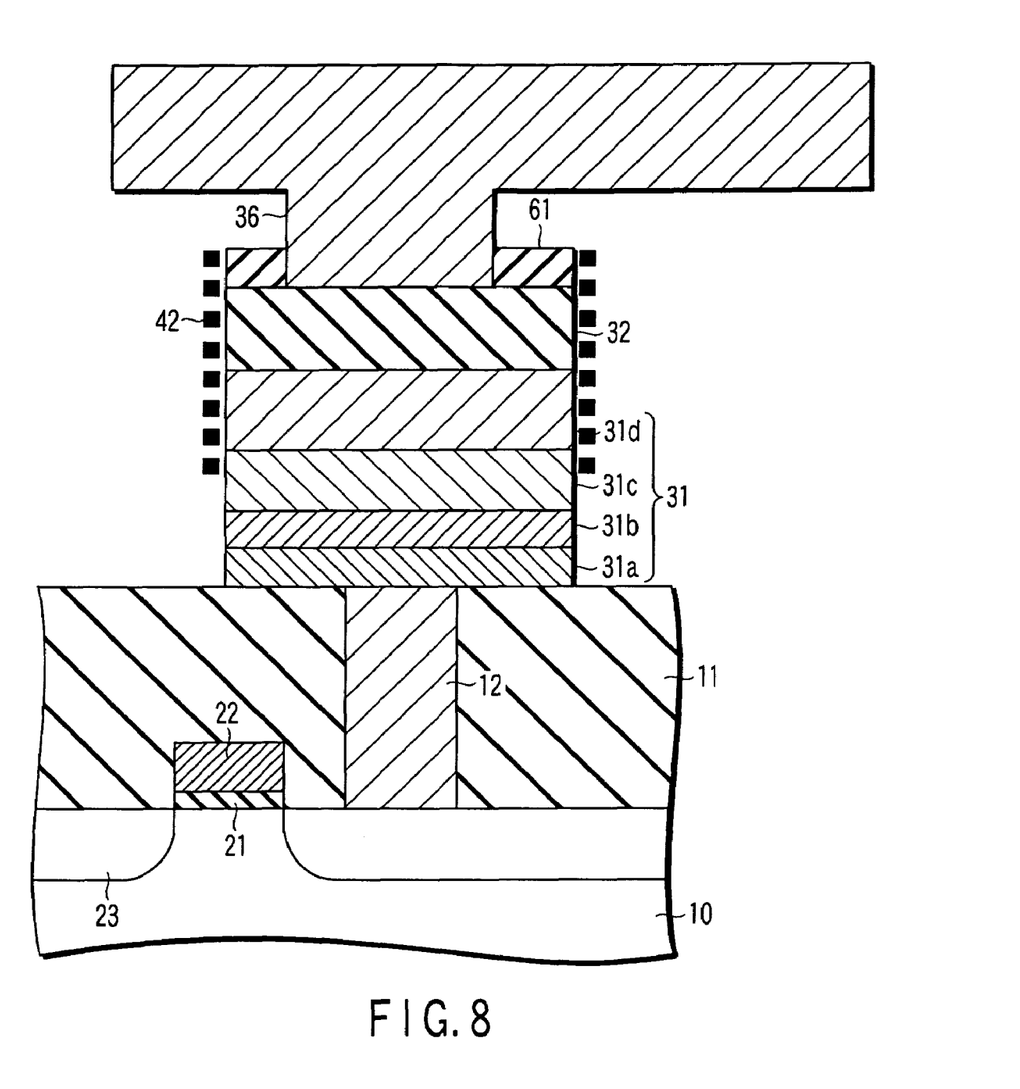
FIG. 8 is a sectional view showing a modification of the second embodiment of this invention.

The structure of FIG. 6 has been obtained by burying the upper-electrode material, by imparting a flat upper surface to the film of this material and by forming a wire on the upper electrode formed at the contact section. Instead, the upper-electrode material may be used to provide a main wire or a local wire, as is illustrated in FIG. 8. In this case, an upper electrode 36 is formed on the interlayer insulating film 55 and in the opening of the first mask 61 and is patterned, proving a wire.

In the second embodiment, the upper electrode 35 and the ferroelectric film 32 are not processed at the same time. Rather, the upper electrode 35 is formed, independently of the lower electrode 31 and ferroelectric film 32. More precisely, the upper electrode 35 is formed by filling electrically conductive material in the opening made in the mask 61 after the ferroelectric film 32 and lower electrode 31 have been processed by using the mask 61. This prevents short-circuiting between the lower electrode 31 and the upper electrode 35 in spite of the metal residue remains on the sidewalls of the ferroelectric film 32. Thus, the capacitor leakage can be decreased, improving the characteristics of the ferromagnetic capacitor 30. In addition, the number of PEPs used is just the same as in the case where the ferroelectric film and upper electrode are formed at a time.

Modified Embodiment

The present invention is not limited to the embodiments described above. In the first embodiment, etching is performed to remove the residue, after the etching is carried out to provide the ferroelectric capacitor. Nevertheless, the etching for removing the residue may be carried out at the same time as the etching for providing the ferroelectric capacitor. Moreover, the materials of the ferroelectric film and electrodes constituting the ferroelectric capacitor may be changed in accordance with the specification of the ferroelectric capacitor.

The structures of the embodiments are not limited to ferroelectric memories in which TC parallel units are connected in series. Rather, the present invention can be applied to memories of various types that incorporate ferroelectric capacitors. The invention can be applied also to semiconductor devices, such as MEMSs, which use ferroelectric capacitors as functional elements.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a substrate; and
a ferroelectric capacitor formed on the substrate, comprising a lower electrode, an upper electrode and a ferroelectric film interposed between the lower and upper electrodes, and the ferroelectric film having dented sidewalls from the sidewall surface of the upper electrode.

2. The semiconductor device according to claim 1, wherein the substrate is a semiconductor substrate.

3. The semiconductor device according to claim 1, further comprising: a switching transistor provided on the substrate, and an interlayer insulating film provided on the substrate and covering the transistor, and in which the ferroelectric capacitor is provided on the interlayer insulating film.

4. The semiconductor device according to claim 1, wherein a minimum width of the ferroelectric film is smaller than a minimum width of the upper electrode.

5. The semiconductor device according to claim 1, wherein the sidewalls of the ferroelectric film are concaved.

6. The semiconductor device according to claim 1, wherein the sidewalls of the ferroelectric film are receded by at least 1 nm.

7. The semiconductor device according to claim 1, wherein the sidewalls of the ferroelectric film are receded by a distance that is at most 10% of a width of the upper electrode.

* * * * *